(12) United States Patent
Sabo

(10) Patent No.: US 11,207,833 B2
(45) Date of Patent: Dec. 28, 2021

(54) PRECISION OPTICAL ASSEMBLY METHOD FOR THREE DIMENSIONAL PRINTING

(71) Applicant: 3D Systems, Inc., Rock Hill, SC (US)

(72) Inventor: David Sabo, San Diego, CA (US)

(73) Assignee: 3D Systems, Inc., Rock Hill, SC (US)

( * ) Notice: Subject to any disclaimer, the term of this patent is extended or adjusted under 35 U.S.C. 154(b) by 276 days.

(21) Appl. No.: 16/699,929

(22) Filed: Dec. 2, 2019

(65) Prior Publication Data

US 2020/0189189 A1    Jun. 18, 2020

Related U.S. Application Data

(60) Provisional application No. 62/779,764, filed on Dec. 14, 2018.

(51) Int. Cl.

| | |
|---|---|
| *B29C 64/25* | (2017.01) |
| *B29C 64/264* | (2017.01) |
| *B29C 64/245* | (2017.01) |
| *G03F 7/20* | (2006.01) |
| *B33Y 30/00* | (2015.01) |

(52) U.S. Cl.
CPC ............ *B29C 64/25* (2017.08); *B29C 64/245* (2017.08); *B29C 64/264* (2017.08); *G03F 7/70416* (2013.01); *B33Y 30/00* (2014.12); *G03F 7/70375* (2013.01); *Y10T 29/49771* (2015.01)

(58) Field of Classification Search
CPC ..... B29C 64/25; B29C 64/245; B29C 64/264; B29C 64/129; G03F 7/70416; G03F 7/70375; B33Y 30/00; Y10T 29/49771
See application file for complete search history.

(56) References Cited

U.S. PATENT DOCUMENTS

| | | | |
|---|---|---|---|
| 9,486,964 B2 | 3/2016 | Joyce | |
| 2015/0325278 A1 | 11/2015 | Bauer et al. | |
| 2015/0352788 A1 | 12/2015 | Livingston et al. | |
| 2016/0046075 A1* | 2/2016 | DeSimone | B33Y 10/00 |
| | | | 264/401 |
| 2016/0052205 A1 | 2/2016 | FrantzDale | |
| 2018/0264719 A1 | 9/2018 | Rolland et al. | |
| 2018/0345579 A1 | 12/2018 | Harris et al. | |
| 2020/0189190 A1* | 6/2020 | Sabo | B33Y 50/02 |
| 2020/0198236 A1* | 6/2020 | Sabo | B29C 64/393 |
| 2020/0307100 A1* | 10/2020 | Sabo | B33Y 10/00 |
| 2021/0323230 A1* | 10/2021 | Sabo | B29C 64/393 |

FOREIGN PATENT DOCUMENTS

| | | |
|---|---|---|
| CN | 207359636 | 5/2018 |

\* cited by examiner

*Primary Examiner* — Ryan J. Walters

(57) ABSTRACT

A method of assembling a three-dimensional printing system includes providing a plurality of components, providing a plurality of spacer rings, and measurement, analysis and assembly steps. The components include a light engine, an adaptive support apparatus, a plurality of elongate struts, and a support plate. The measurement, analysis and assembly steps include (1) measuring a scale factor for the light engine, (2) determining a selection of one or more of the spacer rings based upon the measured scale factor, and (3) assembling the components with the determined selection of one or more spacer rings.

14 Claims, 9 Drawing Sheets

PRECISION OPTICAL ASSEMBLY METHOD FOR THREE DIMENSIONAL PRINTING

CROSS-REFERENCE TO RELATED APPLICATIONS

This non-provisional patent application claims priority to U.S. Provisional Application Ser. No. 62/779,764, Entitled "PRECISION OPTICAL ASSEMBLY METHOD FOR THREE DIMENSIONAL PRINTING" by David Sabo, filed on Dec. 14, 2018, incorporated herein by reference under the benefit of U.S.C. 119(e).

FIELD OF THE INVENTION

The present disclosure concerns an apparatus and method for fabrication of solid three dimensional (3D) articles of manufacture from radiation curable (photocurable) resins. More particularly, the present invention improves the fabrication accuracy of a three dimensional (3D) article of manufacture by providing a precision calibration method for an optical path.

BACKGROUND

Three dimensional (3D) printers are in rapidly increasing use. One class of 3D printers includes stereolithography printers having a general principle of operation including the selective curing and hardening of radiation curable (photocurable) liquid resins. A typical stereolithography system includes a resin vessel holding the photocurable resin, a movement mechanism coupled to a support surface, and a controllable light engine. The stereolithography system forms a three dimensional (3D) article of manufacture by selectively curing layers of the photocurable resin. Each selectively cured layer is formed at a "build plane" within the resin.

Some stereolithographic 3D printers utilize a projection light engine that includes a light source, a spatial light modulator, and projection optics. One challenge with such light engines is a variability in a scale factor for a given distance along an optical path from the light engine to the build plane. Software is sometimes used to provide scaling error corrections, but that solution is not optimal.

SUMMARY

Figure 1:
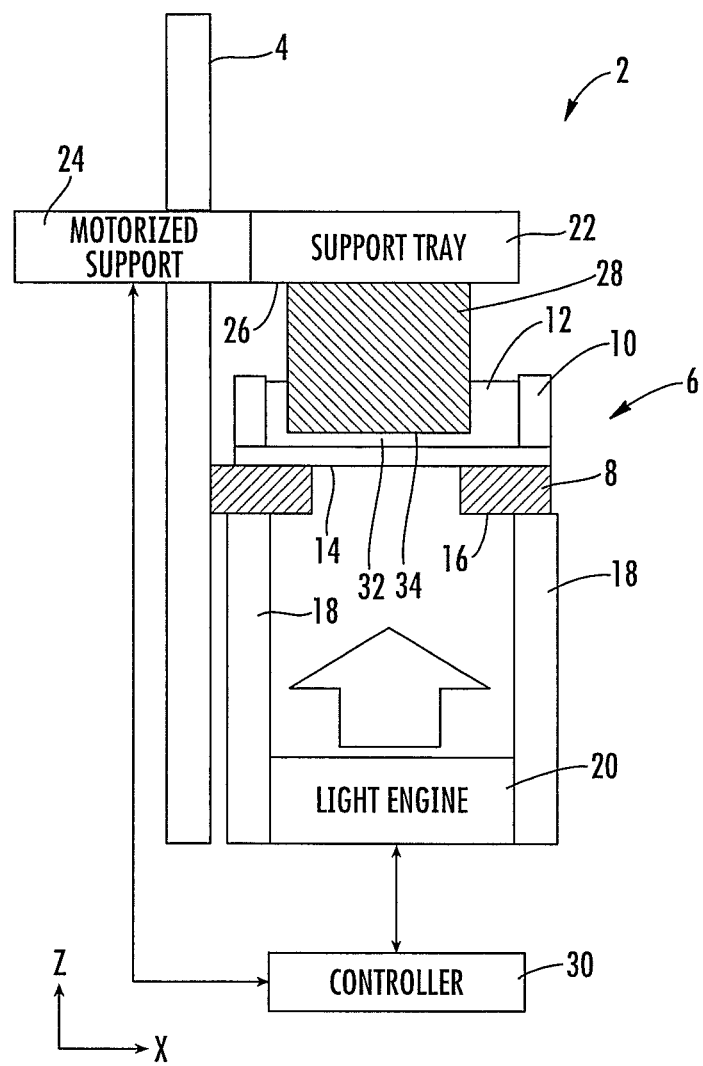
FIG. 1 is a block diagram schematic of an embodiment of a three-dimensional printing system.

In a first aspect of the disclosure, a method of assembling a three-dimensional printing system includes providing a plurality of components, providing a plurality of spacer rings, and measurement, analysis and assembly steps. The components include a light engine, an adaptive support apparatus, a plurality of elongate struts, and a support plate. The measurement, analysis and assembly steps include (1) measuring a scale factor for the light engine, (2) determining a selection of one or more of the spacer rings based upon the measured scale factor, and (3) assembling the components with the determined selection of one or more spacer rings.

In one implementation, the plurality of spacer rings includes spacer rings of varying thickness including a nominal spacer ring having a nominal thickness. Measuring the scale factor includes (1) partially assembling the components including disposing the nominal spacer ring between an upper portion of the light engine and the adaptive support apparatus, (2) projecting an image from the light engine to a simulated build plane, and (3) measuring a dimension of the image.

In another implementation, an upper portion of the light engine includes a projection lens module having a laterally extending flange. Assembling the components includes disposing the selected one or more spacer rings between the laterally extending flange and the adaptive support apparatus.

In yet another implementation, an upper portion of the light engine includes an upper housing. Assembling the components includes attaching the adaptive support apparatus to the upper housing.

In a further implementation, an upper portion of the light engine includes an upper housing and a projection lens module. The upper housing defines an opening. The projection lens module includes a laterally extending flange with upper and lower portions extending upwardly and downwardly from the flange, respectively. Assembling includes mounting the flange upon or above the upper housing whereby the lower portion extends into the opening in the upper housing.

In a yet further implementation, the adaptive support apparatus includes an interface plate and a lateral adapter. Assembling includes coupling the interface plate to an upper portion of the light engine and coupling the lateral adapter to the interface plate.

In a yet further implementation, assembling includes coupling the elongate struts between a downward-facing surface of the support plate and an upward-facing surface of the adaptive support apparatus.

In another implementation, the plurality of spacer rings have a varying thickness. Determining a selection includes selecting an optimal set of the varying width spacer rings to achieve a desired scale factor.

In a second aspect of the disclosure, a method of assembling a three-dimensional printing system includes providing a plurality of components, providing a plurality of spacer rings, and measurement, analysis, and assembly steps. The plurality of components include a light engine, an adaptive support apparatus, and a support plate. The light engine has an upper portion with a projection lens module and an upper housing. The measurement, analysis, and assembly steps include (1) measuring a scale factor for the light engine, (2) determining a selection of one or more of the spacer rings based upon the measured scale factor, and assembly. Assembly includes disposing the selected one or more spacer rings between the adaptive support apparatus and the projection lens module, attaching the adaptive support apparatus to the upper housing, and coupling the plurality of elongate struts between a downward-facing surface of the support plate and an upward-facing surface of the adaptive support apparatus.

In one implementation the projection lens module includes a laterally extending flange with an upward-facing flange surface. The selected one or more spacer rings are disposed between the upward-facing flange surface and a downward-facing surface of the adaptive support apparatus. The upper housing defines an opening. The projection lens module includes upper and lower portions extending upwardly and downwardly from the flange respectively. The lower portion is received into the opening and the flange is mounted above the opening.

In a third aspect of the disclosure, a method of assembling a three-dimensional printing system includes providing a plurality of components, providing a plurality of spacer rings, and measurement, analysis, and assembly steps. The plurality of components includes a light engine having an upper portion with a projection lens module and an upper housing, an adaptive support apparatus further including a lateral adapter and an interface plate, a plurality of elongate struts, and a support plate. The measurement, analysis, and assembly steps includes measuring a scale factor for the light engine, determining a selection of one or more of the spacer rings based upon the measured scale factor, and completing assembly. Assembly includes disposing the selected one or more spacer rings between the interface plate and the projection lens module and attaching the interface plate to the upper housing.

In one implementation the projection lens module has a laterally extending flange. The one or more spacer rings are disposed between an upward-facing surface of the laterally extending flange and a downward-facing surface of the interface plate. Assembly includes attaching the lateral adapter to the downward-facing surface of the interface plate and coupling the plurality of elongate struts between a downward-facing surface of the support plate and an upward-facing surface of the lateral adapter.

DETAILED DESCRIPTION OF THE PREFERRED EMBODIMENTS

FIG. 1 is a block diagram schematic of an embodiment of a three-dimensional printing system 2. In describing system 2, mutually perpendicular axes X, Y, and Z will be utilized in various views. Axes X and Y are lateral axes that are generally horizontal. Axis Z is a vertical axis that is generally aligned with a gravitational reference. Upwardly is in the +Z direction and downwardly is in the −Z direction. An upper surface generally faces upwardly and a lower surface generally faces downwardly. "Generally" faces upwardly or downwardly means that the surface may have undulations or recesses that don't exactly face in a particular direction but the overall surface is a top or bottom surface respectively.

A vertical support 4 is coupled to a resin support apparatus 6. Resin support apparatus 6 includes a support plate 8 that is coupled to the vertical support 4. The support plate 8 supports a resin vessel 10 containing a photocurable resin 12. Resin vessel 10 includes a transparent sheet 14 on a lower side that defines a lower bound for resin 12 contained in the resin vessel 10.

Extending downwardly from a downward-facing surface 16 of the support plate 8 are a plurality of struts 18. The struts 18 support a light engine 20 at a fixed distance from the support plate 8. The light engine 20 projects light up through the transparent sheet 14 to define a build plane 32 that is proximate to a lower face 34 of the three-dimensional article 28.

A support tray 22 is coupled to a motorized support 24. Support tray 22 has a lower surface 26 supporting a three-dimensional article 28 that is being manufactured by system 2. A controller 30 is controllably coupled to the light engine 20 and the motorized support 24.

The controller 30 includes a processor and an information storage device. The information storage device includes a non-transient or non-volatile storage device storing software instructions. When executed by the processor, the software instructions operate the light engine 20 and the motorized support 24 to fabricate the three-dimensional article 28 in a layer-by-layer manner. The controller can be embodied at one location or multiple locations within and/or outside of the three-dimensional printing system 2.

In one embodiment, the controller 30 is configured to manufacture a three-dimensional article using the following steps: (1) Operate the motorized support 24 to position the lower surface 26 of support tray 22 at the build plane 32. (2) Operate the light engine 30 to selectively cure resin 12 at the build plane which accretes onto the lower surface 26 of the support tray 22. (3) Operate the motorized support 24 to position a lower face 34 of cured resin at the build plane 32. (4) Repeat step (2). Then, repeat steps (3) and (4) to selectively accrete remaining layers of resin onto the lower face 34 to complete fabrication of the three-dimensional article 28.

Figure 2:
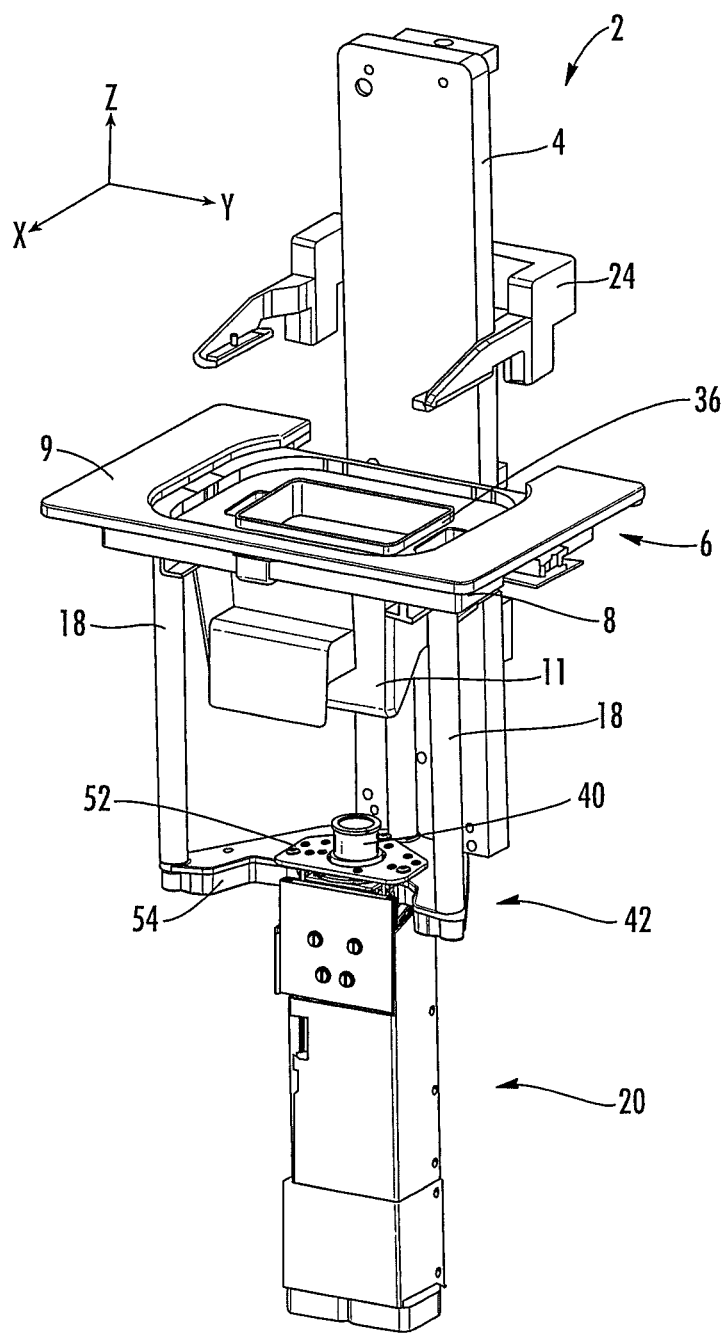
FIG. 2 is an isometric drawing illustrating mechanical aspects of an embodiment of a three-dimensional printing system.

FIG. 2 is an isometric drawing illustrating additional mechanical details of an embodiment of system 1. The support plate 8 includes a ridge 36. When the resin vessel 10 is installed upon the support plate 8 the ridge 36 impinges upon a lower surface of the transparent sheet 14. This is further illustrated in FIGS. 3 and 4.

Figure 3:
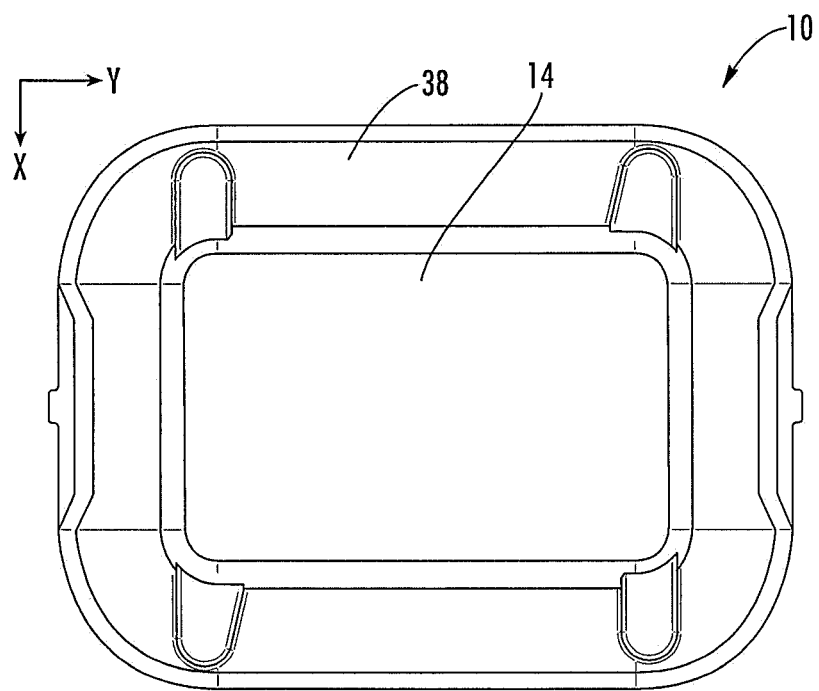
FIG. 3 is a top view of an embodiment of a resin vessel.
Figure 4:
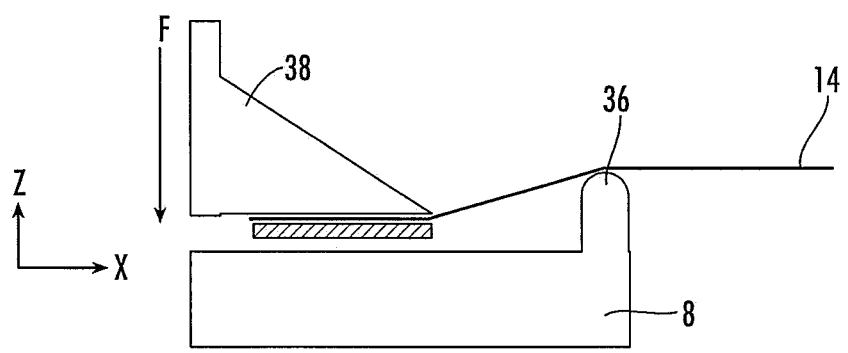
FIG. 4 is a diagram representing a cross-section taken through portions of a resin vessel and a support plate that supports the resin vessel.

FIG. 3 is a top view of an embodiment of the resin vessel 10. Resin vessel 10 has a sloped frame 38 that supports the transparent sheet 14. In the illustrated embodiment, the transparent sheet 14 is formed from a flexible polymeric material. FIG. 4 is a diagram representing a cross-section taken through a portion of the frame 38, transparent film 14, and the support plate 8. A downward force F of the frame (weight and external force) is counteracted by an upward force of the ridge 36 upon the transparent film 14. This has the effect of tensioning the transparent film 14. The ridge 36 controls a height of the transparent film 14. This is an important factor in controlling a vertical distance between the light engine 20 and the build plane 32.

In the illustrated embodiment, the ridge 36 is a portion of the support plate 8. In other embodiments, the ridge 36 can be an integral portion of the resin vessel 10. With such an arrangement, the ridge 36 still controls a height of the tensioned transparent film 14 and the build plane 32.

Referring back to FIG. 2, additional details are illustrated. The illustrated light engine 20 is a DMD (digital mirror device) light engine 20. The light engine includes a projection lens module 40 that includes a set of lenses for focusing imaging light upon the build plane 32. An adaptive support apparatus 42 couples and references the struts 18 to the light engine 20. This will be discussed in more detail infra.

As will be discussed infra, the adaptive support apparatus 42 is mechanically referenced to the projection lens module 40. The adaptive support apparatus 42 has a downward facing surface that mechanically references to an upward-facing flange surface of the projection lens module 40.

Figure 5:
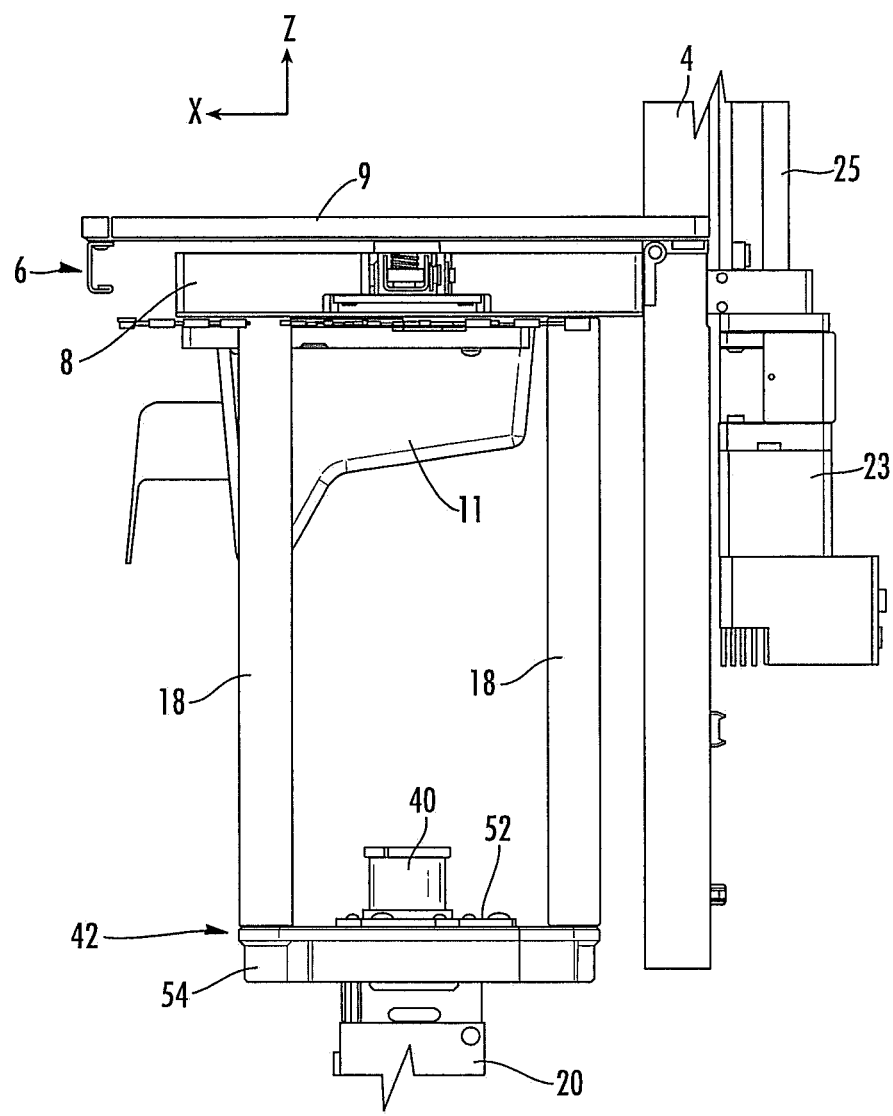
FIG. 5 is a side view of a portion of the system from FIG. 2.

FIG. 5 is a side view of a portion of the system 2 from FIG. 2. The resin support apparatus 6 is shown without the resin vessel 10. Apparatus 6 includes a latching cover 9 that is configured to align and secure the resin vessel 10 onto the support plate 8. In the illustrative embodiment, the support plate 8 is directly connected to the vertical support 4.

Also coupled to the vertical support 4 is a motor 23 that controllably rotates a lead screw 25. Lead screw 25 is threaded into the motorized support 24. Controller 30 controls motor 23 for vertical motion and positioning of the motorized support 24.

Underneath the support plate 8 is a removable resin spill vessel 11. Resin spill vessel 11 captures any spilled resin 12 in an event for which the resin vessel 10 is damaged or overfilled. Resin spill vessel 11 has a transparent lower portion (not shown) to allow light from light engine 20 to reach the transparent sheet 14.

Figure 6:
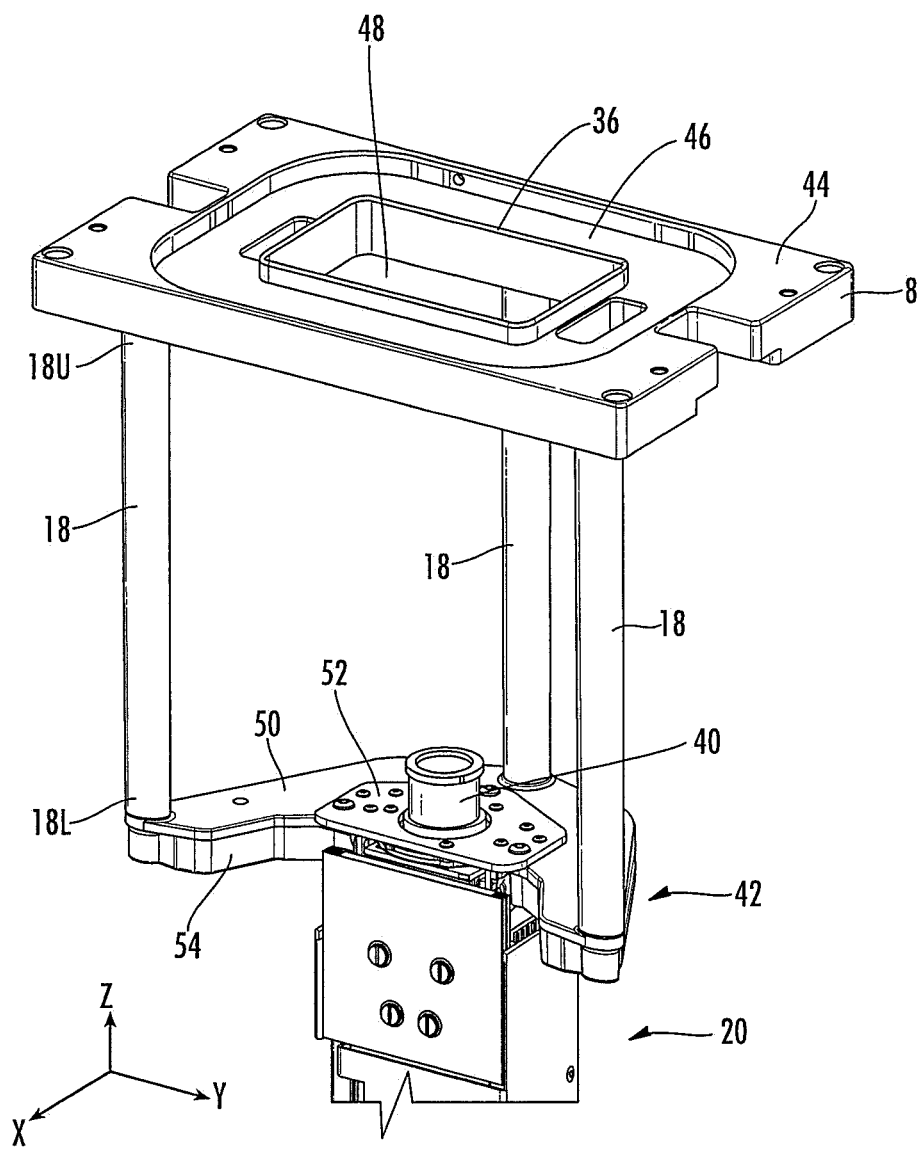
FIG. 6 is an isometric drawing that depicts details of a portion of a three dimensional printing system.

FIG. 6 is an isometric drawing depicting added details from FIG. 2. The support plate 8 has an upper side 44. The upper side 44 includes a recess 46 for receiving a lower portion of the frame 38 of the resin vessel 10. The ridge 36 surrounds an opening 48 in the support plate 8. In operation, the light engine 20 projects radiation up through opening 48 to the transparent sheet 14 which is being tensioned by the ridge 36.

The struts 18 individually have upper 18U and lower 18L ends. The upper end of strut 18 is coupled to the downward facing surface 16 (FIG. 1) of support plate 8. The lower end of strut 18 is coupled to an upward-facing surface 50 of adaptive support 42. Adaptive support 42 includes two parts including an interface plate 52 and a lateral adapter 54. The interface plate 52 couples the lateral adapter 54 to the light engine 20. The lateral adapter 54 defines the upward facing surface 50 that is coupled to the lower ends 18L of the struts 18.

Figure 7:
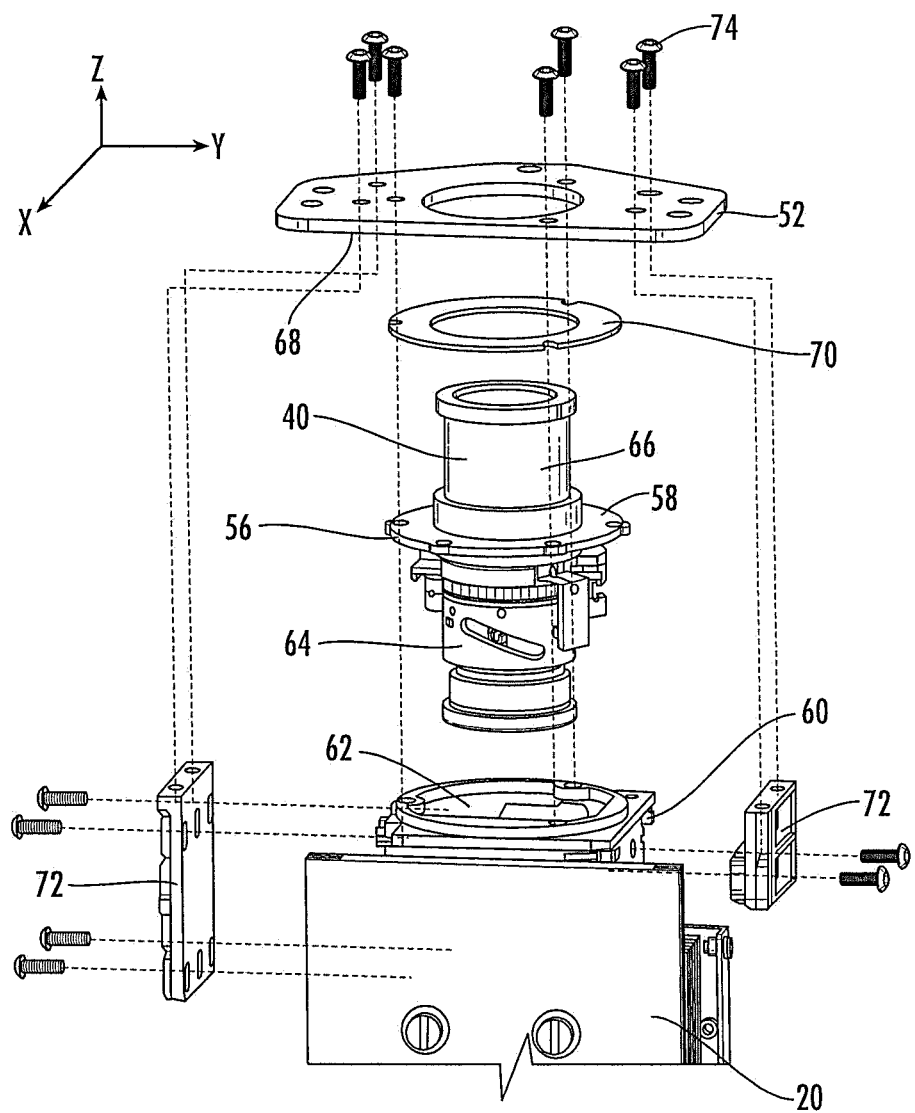
FIG. 7 is an exploded isometric drawing depicting assembly at a top portion of a light engine.
Figure 8:
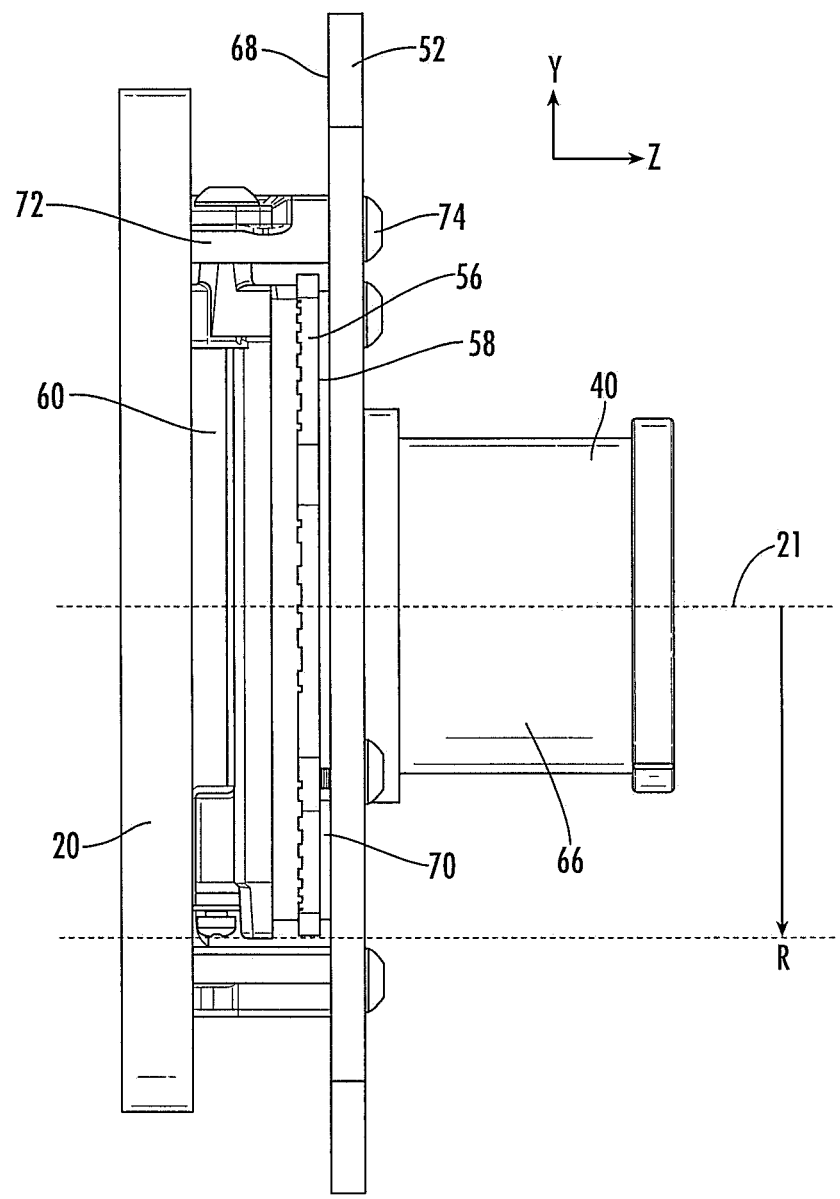
FIG. 8 is a side drawing of a interface plate mounted to a top portion of a light engine.
Figure 9:
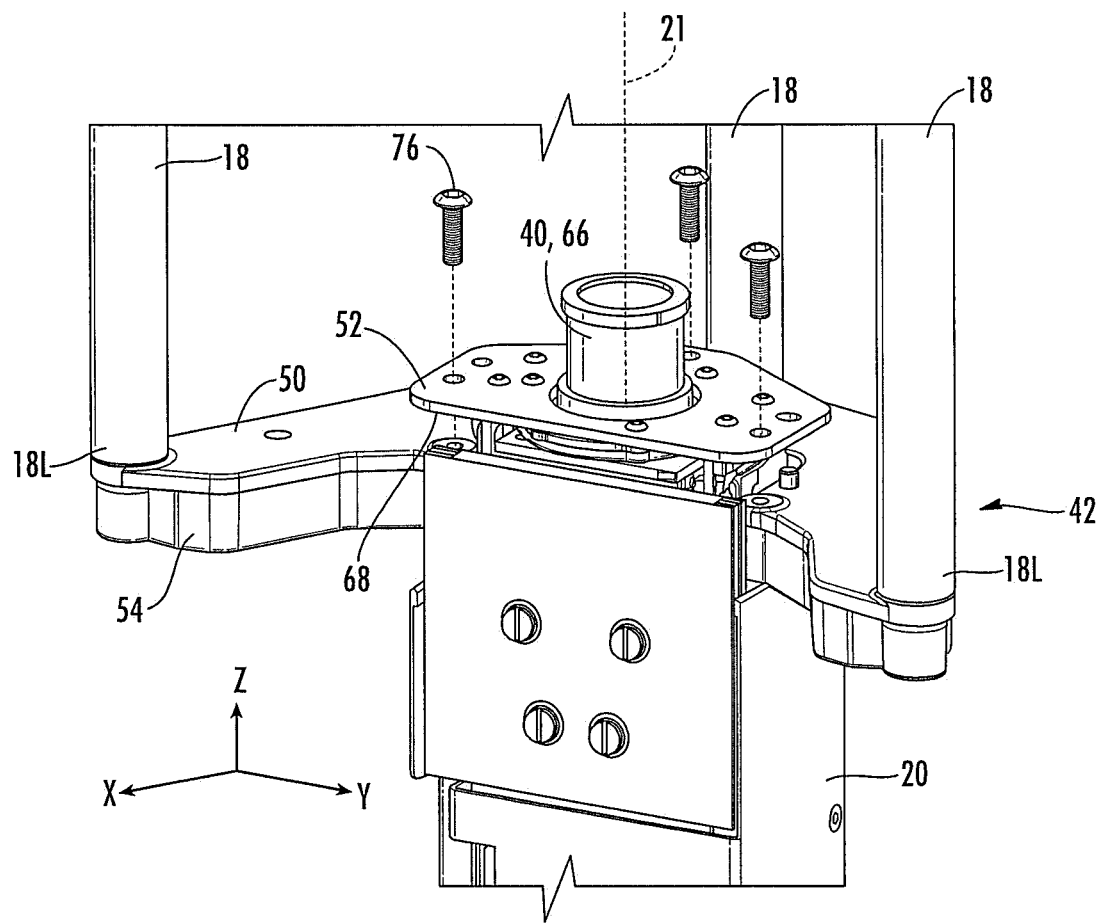
FIG. 9 is an isometric drawing depicting a lateral adapter about to be coupled to an interface plate. Also depicted is a top portion of a light engine coupled to the interface plate and struts coupled to the lateral adapter.

FIGS. 7-9 depict assemblage details of the light engine 20, adaptive support 42, and the struts 18. FIG. 7 is an exploded isometric view depicting assembly at a top portion of light engine 20. Light engine 20 includes the projection lens module 40, which contains a series of optical components (e.g., lenses) that project a light signal to the build plane 32. The projection lens module 40 includes a laterally and radially extending flange 56 having an upward facing flange surface 58.

Light engine 20 also includes an upper housing 60 defining an opening 62. The projection lens module 40 includes a tubular lower portion 64 that is received into the opening 62 such that flange 56 rests upon or above the upper housing 60. The projection lens module 40 also has a tubular upper portion 66 that extends above the flange 56.

The interface plate 52 has a downward-facing surface 68 (or downward-facing adapter surface 68) that is in facing relation with the upward-facing flange surface 58. Between interface plate 62 and flange 56 is a spacer ring 70. Spacer ring 70 can be a plurality of spacer rings 70 of varying thickness. Spacer ring 70 is used to precisely adjust a distance between the projection lens module 40 and the build plane 32. This is a very precise and mechanically robust way of adjusting a scale factor for the projection from light engine 20 to the build plane 32.

The upper housing 60 can include a plurality of stiffeners 72 that are used to rigidify the assembly of the interface plate 52 to the light engine 20. The purpose is to maintain an extremely precise vertical positioning for the interface plate 52 relative to the projection lens module 40 even during shipping of the overall assembly. Screws 74 pass through openings in the interface plate 52 and pass into the upper housing 60 including into the stiffeners 72. Tightening the screws 74 clamps the downward facing surface 68 of interface plate 52 onto the spacer ring 70. The spacer ring 70 in turn is clamped onto the upward-facing surface 58 of flange 56.

The downward-facing surface 68 is "mechanically referenced to" the upward-facing flange surface 58. In other words, they are not attached by screws or bolts or other attachment features. Rather, they are pressed either directly together or with an intervening spacer ring 70 therebetween. On the other hand, the interface plate 52 is attached to the upper housing 60 but it does not reference to it.

FIG. 8 is a side view of the interface plate 52 mounted to a top portion of the light engine 20. Tightened bolts 74 pass through interface plate 52 and into the upper housing 60. Compressed and sandwiched between interface plate 52 and flange 56 is the spacer ring 70. As discussed supra, in an alternative embodiment, the interface plate 52 can directly press against the flange 56 without an intervening spacer ring 70.

FIG. 9 is an isometric drawing depicting the lateral adapter 54 about to be mounted to the interface plate 52. The downward-facing surface 68 of interface plate 52 is in facing relation with the upward-facing surface 50 of the lateral adapter 54. Screws 76 pass through interface plate 52 and into the lateral adapter 54. Tightening screws 76 would press surfaces 68 and 50 together. Also shown are the lower ends 18L of struts 18 mounted into the upward facing surface 50 of the lateral adapter 54.

As depicted in FIG. 9 and earlier figures, mechanical referencing of the adaptive support is between the upward-facing flange surface 58 and the downward-facing surface of the adaptive support apparatus 42. The mechanical referencing between flange 56 and adaptive support apparatus 42 is within a radius R from the optical axis 21 of the light engine 20. This radius R is generally within the radius R of the flange (see FIG. 8). To provide mechanical stability for the support plate 8, the mechanical referencing between struts 18 and the upper-facing surface 50 of the adaptive support apparatus 42 is at a distance of more than 2R from the optical axis 21. In an illustrative embodiment, approximate centers of struts 18 can be at least about 3R or more than 3R from the optical axis 21.

Figure 10:
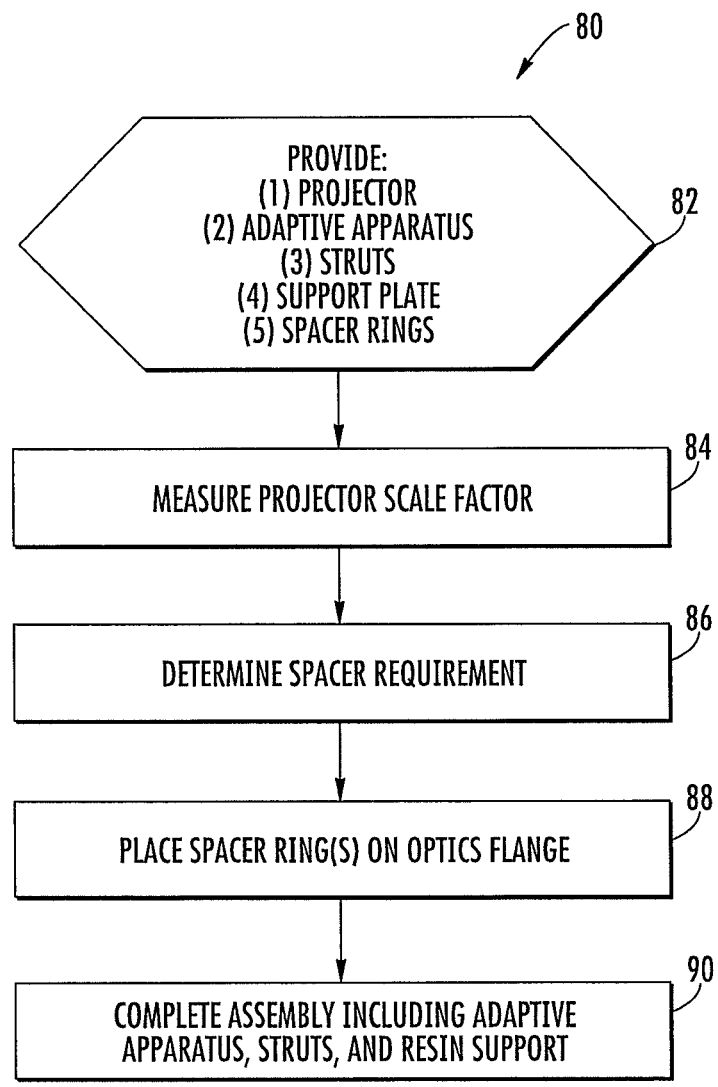
FIG. 10 is a flowchart of an embodiment of a method for assembling portions of a three-dimensional printing system.

FIG. 10 is a flowchart of an embodiment of a method for assembling a portion of system 2. Certain details are left out except as pertain to the proper positioning of the projection lens module 40 relative to the build plane.

According to 82, the following articles are provided: (1) Projector 20 with upper housing 60 and projection lens module 40; (2) adaptive support apparatus 42; (3) struts 18; (4) support plate 8; (5) a plurality of spacer rings 70. In an illustrative embodiment, the articles listed include those described with respect to FIGS. 1-9.

In one embodiment, the spacer rings 70 have varying thicknesses. In one particular embodiment, there are five spacer rings individually having thicknesses of 1 millimeter, 500 microns (0.5 mm), 250 microns, 100 microns, and 50 microns. In an embodiment, the 1 millimeter spacer ring is a "nominal" spacer ring.

According to 84, the projector 20 scale factor is measured. The scale factor correlates with a feature size of a projected image feature at the build plane 32. If the feature size is too small, then the projector needs to be moved away from the build plane. The adaptive support apparatus 42 and struts 18 are sized whereby the projected image feature correct with the installation of a nominal spacer ring which defines a nominal vertical position. The measured scale factor from step 84 will determine whether and how far the projector needs to be moved downward from a nominal position.

In one embodiment of step 84, the plurality of spacer rings 70 includes a spacer ring having a nominal thickness. Measuring the scale factor includes (1) partially assembling the components including disposing the nominal spacer ring between an upper portion of the light engine and the adaptive support apparatus, (2) projecting an image from the light engine to a simulated build plane, and (3) measuring a dimension of the image. In an illustrative embodiment, measuring a dimension of the image includes measuring one or more distances between features (or the centroids of features) in the image. In another illustrative embodiment, measuring a dimension of the image includes individually measuring a dimension or area of a feature in the image.

According to 86 a selection of one or more of the spacer rings 70 is determined. The determination is based upon the measured scale factor.

According to 88, the selected one or more spacer rings 70 are placed upon the upward-facing flange surface 58. According to 90, remaining assembly takes place between the above-listed elements.

In one particular embodiment, steps 88 and 90 include the following steps: (1) Disposing the selected one or more spacer rings between the interface plate 52 and the flange 56. (2) Attaching the interface plate 52 to housing 60. (3) Attaching the lateral adapter 54 to the interface plate 54. (4) Coupling the struts 18 between the support plate 8 and the lateral adapter 54. In other embodiments the order of these steps can vary.

The specific embodiments and applications thereof described above are for illustrative purposes only and do not preclude modifications and variations encompassed by the scope of the following claims.

What is claimed:

1. A method of assembling a three-dimensional printing system comprising:
   providing a plurality of components including:
      a light engine;
      an adaptive support apparatus;
      a plurality of elongate struts; and
      a support plate;
   providing a plurality of spacer rings;
   measuring a scale factor for the light engine;
   determining a selection of one or more of the spacer rings based upon the measured scale factor; and
   assembling the plurality of components with the determined selection of one or more spacer rings.

2. The method of claim 1 wherein the plurality of spacer rings includes a spacer ring having a nominal thickness, measuring the scale factor includes (1) partially assembling the components with the nominal thickness spacer ring between the projection lens module and a portion of the adaptive support apparatus, (2) projecting an image from the projector to a simulated build plane, and (3) measuring a dimension of projected image features.

3. The method of claim 1 wherein an upper portion of the light engine includes a projection lens module having a laterally extending flange, assembling includes disposing the selected one or more spacer rings between the laterally extending flange and the adaptive support apparatus.

4. The method of claim 1 wherein an upper portion of the light engine includes an upper housing, assembling includes attaching the adaptive support apparatus to the upper housing.

5. The method of claim 1 wherein an upper portion of the light engine includes and upper housing and a projection lens module, the upper housing defines an opening, the projection lens module includes a laterally extending flange with upper and lower portions extending upwardly and downwardly from the flange, respectively, assembling includes mounting the flange upon or above the upper housing whereby the lower portion extends into the opening in the upper housing.

6. The method of claim 1 wherein the adaptive support apparatus includes an interface plate and a lateral adapter, assembling includes coupling the interface plate to an upper portion of the light engine and coupling the lateral adapter to the interface plate.

7. The method of claim 1 wherein assembling includes coupling the elongate struts between a downward-facing surface of the support plate and an upward-facing surface of the adaptive support apparatus.

8. The method of claim 1 wherein the plurality of spacer rings have a varying thickness, determining a selection includes selecting an optimal set of the varying width spacer rings to achieve a desired scale factor.

9. A method of assembling a three-dimensional printing system comprising:
   providing a plurality of components including
      a light engine having an upper portion with a projection lens module and an upper housing;
      an adaptive support apparatus;
      a plurality of elongate struts; and
      a support plate;
   providing a plurality of spacer rings;
   measuring a scale factor for the light engine;
   determining a selection of one or more of the spacer rings based upon the measured scale factor; and
   assembling the plurality of components with the determined selection of one or more spacer rings including:
      disposing the selected one or more spacer rings between the adaptive support apparatus and the projection lens module;
      attaching the adaptive support apparatus to the upper housing; and
      coupling the plurality of elongate struts between a downward-facing surface of the support plate and an upward-facing surface of the adaptive support apparatus.

10. The method of claim 9 wherein the projection lens module includes a laterally extending flange with an upward-facing flange surface, the selected one or more spacer rings are disposed between the upward-facing flange surface and a downward-facing surface of the adaptive support apparatus.

11. The method of claim 10 wherein upper housing defines an opening, the projection lens module includes upper and lower portions extending upwardly and downwardly from the flange, respectively, the lower portion is received into the opening and the flange is mounted above the opening.

12. A method of assembling a three-dimensional printing system comprising:
   providing a plurality of components including
      a light engine having an upper portion with a projection lens module and an upper housing;
      an adaptive support apparatus including a lateral adapter and an interface plate;
      a plurality of elongate struts; and
      a support plate;
   providing a plurality of spacer rings;

measuring a scale factor for the light engine;
determining a selection of one or more of the spacer rings based upon the measured scale factor; and
assembling the plurality of components with the determined selection of one or more spacer rings including:
  disposing the selected one or more spacer rings between the interface plate and the projection lens module; and
  attaching the interface plate to the upper housing.

13. The method of claim 12 wherein the projection lens module has a laterally extending flange, the one or more spacer rings are disposed between an upward-facing surface of the laterally extending flange and a downward-facing surface of the interface plate.

14. The method of claim 13 wherein assembly includes attaching the lateral adapter to the downward-facing surface of the interface plate and coupling the plurality of elongate struts between a downward-facing surface of the support plate and an upward-facing surface of the lateral adapter.

\* \* \* \* \*